United States Patent
Takeuchi et al.

(10) Patent No.: US 11,370,917 B2
(45) Date of Patent: Jun. 28, 2022

(54) CURABLE HOTMELT SILICONE COMPOSITION, ENCAPSULANT, FILM AND OPTICAL SEMICONDUCTOR DEVICE

(71) Applicant: DuPont Toray Specialty Materials Kabushiki Kaisha, Tokyo (JP)

(72) Inventors: Shunya Takeuchi, Chiba (JP); Sawako Inagaki, Chiba (JP); Akito Hayashi, Chiba (JP); Akihiko Kobayashi, Chiba (JP)

(73) Assignee: DuPont Toray Specialty Materials Kabushiki Kaisha, Tokyo (JP)

( * ) Notice: Subject to any disclaimer, the term of this patent is extended or adjusted under 35 U.S.C. 154(b) by 66 days.

(21) Appl. No.: 16/934,151

(22) Filed: Jul. 21, 2020

(65) Prior Publication Data

US 2021/0032471 A1    Feb. 4, 2021

(30) Foreign Application Priority Data

Jul. 30, 2019 (JP) .............. JP2019-139794
Apr. 28, 2020 (JP) .............. JP2020-079564

(51) Int. Cl.
| C08G 77/12 | (2006.01) |
| C08L 83/14 | (2006.01) |
| C08G 77/08 | (2006.01) |
| C08G 77/24 | (2006.01) |
| C08K 3/36 | (2006.01) |

(52) U.S. Cl.
CPC .............. C08L 83/14 (2013.01); C08G 77/08 (2013.01); C08G 77/12 (2013.01); C08G 77/24 (2013.01); C08K 3/36 (2013.01); C08L 2203/16 (2013.01); C08L 2203/206 (2013.01)

(58) Field of Classification Search
CPC ......... C08G 77/12; C08G 77/20; C08L 83/04; H01L 33/56
See application file for complete search history.

(56) References Cited

U.S. PATENT DOCUMENTS

| 8,895,678 | B2 | 11/2014 | Yoshitake | |
| 10,167,418 | B2 | 1/2019 | Yamazaki et al. | |
| 2006/0188113 | A1 | 8/2006 | Tice et al. | |
| 2016/0002527 | A1* | 1/2016 | Kim ............... | C08K 5/56 252/301.36 |
| 2017/0355804 | A1 | 12/2017 | Fujisawa et al. | |
| 2018/0208816 | A1* | 7/2018 | Yamazaki ............ | C08K 5/5419 |

FOREIGN PATENT DOCUMENTS

| CN | 203443741 U | 2/2014 |
| JP | S62115389 A | 5/1987 |
| JP | H01232497 A | 9/1989 |
| JP | 2006299099 A | 11/2006 |
| JP | 2006324596 A | 11/2006 |
| JP | 2007246894 A | 9/2007 |
| JP | 2013001794 A | 1/2013 |
| WO | 2015194158 A1 | 12/2015 |

OTHER PUBLICATIONS

English language abstract and machine-assisted English translation for CN 203443741 extracted from espacenet.com database on Aug. 20, 2020, 6 pages.
English language abstract and machine-assisted English translation for JPS 62-115389 extracted from espacenet.com database on Aug. 20, 2020, 5 pages.
English language abstract and machine-assisted English translation for JPH 01-232497 extracted from espacenet com database on Aug. 20, 2020, 4 pages.
English language abstract and machine-assisted English translation for JP 2006-299099 extracted from espacenet.com database on Aug. 20, 2020, 15 pages.
English language abstract and machine-assisted English translation for JP 2006-324596 extracted from espacenet.com database on Aug. 20, 2020, 11 pages.
English language abstract and machine-assisted English translation for JP 2007-246894 extracted from espacenet.com database on Aug. 20, 2020, 15 pages.
English language abstract for JP 2013-001794 extracted from espacenet. com database on Aug. 20, 2020, 1 page.
English language abstract for WO 2015/194158 extracted from espacenet.com database on Aug. 20, 2020, 2 pages.

\* cited by examiner

*Primary Examiner* — Kuo Liang Peng
(74) *Attorney, Agent, or Firm* — Howard & Howard Attorneys PLLC

(57) ABSTRACT

A curable hot-melt silicone composition exhibits excellent mechanical properties, particularly strength and extension, even when formed in a film or sheet shape. The curable hot-melt silicone composition contains (A) alkenyl group-containing organopolysiloxane having at least 2 alkenyl groups per molecule, (B) branched organohydrogenpolysiloxane having at least 2 silicon-bonded hydrogen atoms per molecule, at 0.1 to 5% by mass relative to the total mass of the composition, (C) additive represented by average unit formula (C-1), (D) hydrosilylation catalyst, and (E) silica.

20 Claims, No Drawings

CURABLE HOTMELT SILICONE COMPOSITION, ENCAPSULANT, FILM AND OPTICAL SEMICONDUCTOR DEVICE

CROSS-REFERENCE TO RELATED APPLICATIONS

The present application claims priority to and all the benefits of Japanese Patent Application No. 2020-079564 filed Apr. 28, 2020 and Japanese Patent Application No. 2019-139794 filed on Jul. 30, 2019, which are both hereby expressly incorporated herein by reference in their entirety.

TECHNICAL FIELD

The present invention relates to a curable silicone composition; more specifically, it relates to a curable silicone composition to be used for encapsulating, coating or adhering an optical semiconductor element. The present invention also relates to an encapsulant comprising this curable silicone composition, and to an optical semiconductor element containing said encapsulant. The present invention also relates to a film obtained by solidifying a curable silicone composition.

BACKGROUND TECHNOLOGY

When curable silicone compositions are cured, they form cured products having excellent heat resistance, cold resistance, electrical insulation, weather resistance, water repellency, and transparency, and so they are used in a wide range of industrial fields. Specifically, compared to other organic materials, these cured products are less prone to discoloration and their physical properties deteriorate less, and so they are suitable for optical materials.

For example, patent documents 1-3 describe resin compositions for optical semiconductor element encapsulation or for optical lenses, obtained using cured silicone resin compositions that contain organopolysiloxane having 2 or more non-covalent double bond groups per molecule, organohydrogenpolysiloxane having 2 or more silicon atom-bonded hydrogen atoms per molecule, and a catalytic amount of platinum catalyst. Patent documents 4 and 5 describe hot-melt silicone resin compositions that are non-fluid at 25° C., have low surface tackiness, and are easily melted by heating.

DOCUMENTS OF THE PRIOR ART

Patent Documents

[Patent document 1] Japanese Unexamined Patent Publication No. 2006-299099
[Patent document 2] Japanese Unexamined Patent Publication No. 2007-246894
[Patent document 3] Japanese Unexamined Patent Publication No. 2006-324596
[Patent document 4] Japanese Unexamined Patent Publication No. 2013-001794
[Patent document 5] International Publication 2015/194158

SUMMARY OF THE INVENTION

Problem to be Solved by the Invention

However, when hot-melt film is prepared using a conventional silicone resin composition, the mechanical properties of the resulting film, particularly its strength and extension, are insufficient. Consequently, there are problems in that when used, for example, to form film-shaped or sheet-shaped encapsulant, and film for lamination, in the manufacture of semiconductor packages, the resulting film breaks easily and has insufficient handling workability.

The aim of the present invention is to provide a curable hot-melt silicone composition that can exhibit excellent mechanical properties, particularly strength and extension, even when formed in a film or sheet shape. More specifically, it is to provide a curable hot-melt silicone composition having excellent handling workability, that can form sheet-shaped or film-shaped encapsulant and film for lamination and allows efficient manufacture of semiconductor packages.

Means of Solving the Problem

As a result of their diligent investigation into solving the problem described above, the present inventors arrived at the present invention upon discovering that said problem can be solved by a solvent-free curable hot-melt silicone composition that contains (A) organopolysiloxane having at least 2 alkenyl groups per molecule, (B) resinous organohydrogenpolysiloxane having at least 2 silicon-bonded hydrogen atoms per molecule, at 0.1 to 5% by mass relative to the total mass of the composition, (C) additive represented by average unit formula (C-1):

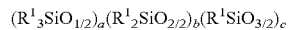

(in the formula, $R^1$ is an identical or different alkyl group, aryl group, alkenyl group, aralkyl group, or epoxy group-containing organic group, where at least one $R^1$ is an alkenyl group, and at least one $R^1$ is an epoxy group-containing organic group; and a, b, and c are numbers that satisfy $0 \leq a \leq 1.0$, $0 \leq b \leq 1.0$, $0 \leq c < 0.9$, respectively, and $a+b+c=1$), (D) hydrosilylation catalyst, and (E) silica.

In one embodiment of the present invention, component (A) contains resinous organopolysiloxane containing at least one $(Ar_2SiO_{2/2})$ unit.

In one embodiment of the present invention, component (B) is represented by average unit formula (B-1):

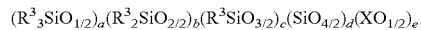

(in the formula, $R^3$ is an identical or different halogen-substituted or unsubstituted monovalent hydrocarbon group, where at least two $R^3$ are hydrogen atoms; X is a hydrogen atom or alkyl group; and a, b, c, d, and e are numbers that satisfy $0 \leq a \leq 1.0$, $0 \leq b \leq 1.0$, $0 \leq c < 0.9$, $0 \leq d < 0.5$, $0 \leq e < 0.4$, $a+b+c+d=1.0$, and $c+d>0$).

In said average unit formula (B-1), a can be in the range $0.1 \leq a \leq 0.9$, b can be in the range $0 \leq b \leq 0.8$, c can be in the range $0.1 \leq c \leq 0.9$, d can be in the range $0 \leq d \leq 0.4$, and e can be in the range $0 \leq e \leq 0.3$.

In said average unit formula (C-1), a can be in the range $0 \leq a \leq 0.9$, b can be in the range $0.1 \leq b \leq 0.9$, and c can be in the range $0.01 \leq c \leq 0.8$.

The alkenyl group content in component (C) can be $\geq 5$ mol % of the total amount of $R^1$.

The epoxy group-containing organic group content in component (C) can be $\geq 5$ mol % of the total amount of $R^1$.

In one embodiment of the present invention, component (A) contains linear, branched, and cyclic organopolysiloxane.

The present invention also relates to a film obtained by solidifying the inventive curable hot-melt silicone composition.

The present invention also relates to an encapsulant comprising the inventive curable hot-melt silicone composition.

The present invention also relates to an optical semiconductor element containing the inventive encapsulant.

The inventive semiconductor element is preferably a light-emitting diode.

Advantages of the Invention

The inventive curable hot-melt silicone composition can exhibit excellent mechanical properties, particularly strength and extension, even when formed as a film or sheet. Therefore, the inventive curable hot-melt silicone composition has excellent handling workability and can form sheet-shaped or film-shaped encapsulant and film for lamination, and allows efficient manufacture of semiconductor packages.

The inventive encapsulant is formed from the inventive curable hot-melt silicone composition and therefore can exhibit excellent mechanical properties, particularly strength and extension, and as a result it has excellent handling workability. Consequently, semiconductor packages can be manufactured efficiently.

MODE OF THE INVENTION

The present invention is described in more detail below.
[Curable Hot-Melt Silicone Composition]

The present invention relates to a solvent-free curable hot-melt silicone composition that contains (A) organopolysiloxane having at least 2 alkenyl groups per molecule, (B) resinous organohydrogenpolysiloxane having at least 2 silicon-bonded hydrogen atoms per molecule, at 0.1 to 5% by mass relative to the total mass of the composition, (C) additive represented by average unit formula (C-1):

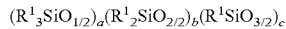

(in the formula, $R^1$ is an identical or different alkyl group, aryl group, alkenyl group, aralkyl group, or epoxy group-containing organic group, where at least one $R^1$ is an alkenyl group, and at least one $R^1$ is an epoxy group-containing organic group; and a, b, and c are numbers that satisfy $0 \le a \le 1.0$, $0 \le b \le 1.0$, $0 \le c < 0.9$, respectively, and $a+b+c=1$), (D) hydrosilylation catalyst, and (E) silica.

The inventive silicone composition does not contain solvent, and when formed, by heat treatment, into a film shape, sheet shape, or the like, it is hot-meltable. In the present specification, "hot-meltable" (hot-melt) refers to the property of being non-fluid at 25° C., but easily melted to exhibit fluidity on heating. For example, the inventive hot-melt silicone composition has a melt elastic modulus at 100° C. that is in the range of 10 Pa to 1 MPa. Here, "non-fluid" means that it does not flow when in a load-free state; it is below its softening point, as measured by the softening point test method in accordance with the ring-and-ball method for hot-melt adhesives specified in JIS K 6863-1994 "Test method for softening point of hot melt adhesives", for example. That is, the inventive hot-melt silicone composition preferably has a softening point higher than 25° C. It should be noted that the melt elastic modulus at 100° C. can be measured using a flat plate type viscoelastometer with temperature control. Also, the inventive silicone composition is hot-meltable and curable; it is a curable hot-melt silicone composition.

This inventive curable hot-melt silicone composition can exhibit excellent mechanical properties, particularly strength and extension, even when formed in a film or sheet shape. Consequently, the inventive curable hot-melt silicone composition has excellent handling workability and can form encapsulant and lamination film for the manufacture of semiconductor packages, and allows efficient manufacture of semiconductor packages.

The various components are described in detail below.

(A) Alkenyl Group-Containing Organopolysiloxane

Component (A) is an alkenyl group-containing organopolysiloxane having at least 2 silicon atom-bonded alkenyl groups per molecule; it is the main agent in the inventive curable silicone composition.

Examples of alkenyl groups that can be contained in component (A) are C2-12 alkenyl groups such as vinyl, allyl, butenyl, pentenyl, hexenyl, heptenyl, octenyl, nonenyl, decenyl, undecenyl, and dodecenyl groups, and vinyl groups are preferred.

Examples of the molecular structure of component (A) are linear, linear with some branching, branched, cyclic, and 3D network structures. Component (A) can be one organopolysiloxane having such a molecular structure, or it can be a mixture of 2 or more such organopolysiloxanes. The inventive curable silicone composition preferably contains linear organopolysiloxane and branched resinous organopolysiloxane as component (A).

In one embodiment of the present invention, component (A) can be a linear organopolysiloxane represented by

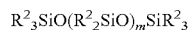  (A-1) average unit formula:

(in the formula, R 2 is an identical or different halogen-substituted or unsubstituted monovalent hydrocarbon group, where at least two R 2 per molecule are alkenyl groups, and m is an integer from 4-1000), and/or a branched organopolysiloxane represented by

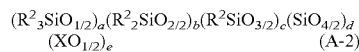  (A-2) average unit formula:

(in the formula, $R^2$ is as described above, where at least two $R^2$ per molecule are alkenyl groups, X is a hydrogen atom or alkyl group, and a, b, c, d, and e are numbers that satisfy $0 \le a \le 1.0$, $0 \le b \le 1.0$, $0 \le c < 0.9$, $0 \le d < 0.5$, $0 \le e < 0.4$, $a+b+c+d+e=1.0$, and $c+d>0$), and/or a cyclic organopolysiloxane represented by (A-3) average unit formula: $(R^2SiO_{2/2})_n$ (in the formula, $R^2$ is as described above, where at least two $R^2$ per molecule are alkenyl groups, and n is an integer from 3-50).

Preferably, the inventive curable hot-melt silicone composition contains linear and branched organopolysiloxane as component (A). More preferably, the inventive curable hot-melt silicone composition contains linear, branched, and cyclic organopolysiloxane as component (A). It should be noted that branched organopolysiloxane is resinous organopolysiloxane, and refers to organopolysiloxane containing per molecule at least one T unit or Q unit, of the siloxane units represented by general formula $R_3SiO_{1/2}$ (M unit), general formula $R_2SiO_{2/2}$ (D unit), general formula $RSiO_{3/2}$ (T unit), and formula $SiO_{4/2}$ (Q unit).

Examples of halogen-substituted or unsubstituted monovalent hydrocarbon groups $R^2$ in the abovementioned formulae are C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; C2-12 alkenyl groups such as vinyl, allyl, butenyl, pentenyl, hexenyl, heptenyl, octenyl, nonenyl, decenyl, undecenyl, and dodecenyl groups; and groups obtained by substituting some or all of the hydrogen atoms of these groups with halogen atoms such as fluorine, chlorine, and/or bromine atoms. $R^2$ may also be a hydroxyl group or an alkoxy group such as methoxy or ethoxy, in small amounts, provided that this does not adversely affect the aim of the present invention.

$R^2$ is preferably chosen from phenyl group, C1-6 alkyl groups or cycloalkyl groups, and C2-6 alkenyl groups.

There are no particular limitations regarding the alkenyl group content in component (A), and preferably 0.01-50 mol %, 0.05-40 mol %, or 0.09-32 mol % of the total amount of $R^2$ is alkenyl group. It should be noted that the alkenyl group content can be found by analysis such as Fourier transform infrared spectrophotometry (FT-IR), nuclear magnetic resonance (NMR), etc.

Component (A) preferably contains resinous organopolysiloxane containing at least one $(Ar_2SiO_{2/2})$ unit.

The resinous organopolysiloxane containing at least one $(Ar_2SiO_{2/2})$ unit, as inventive component (A), is such that the proportion of T units in the molecular structure is preferably 0.1 or more, more preferably 0.2 or more, and even more preferably 0.3 or more. In a preferred embodiment, the inventive resinous organopolysiloxane is such that the proportion of T units in the molecular structure is ≤0.9, preferably ≤0.85, more preferably ≤0.8. In another preferred embodiment, the inventive resinous organopolysiloxane is such that the proportion of Q units in the molecular structure is ≤0.2, preferably ≤0.1, and more preferably it contains no Q units. It should be noted that the abovementioned proportions of T units and Q units can be calculated based on the amount of siloxane units represented by general formula $R_3SiO_{1/2}$ (M unit), general formula $R_2SiO_{2/2}$ (D unit), general formula $R SiO_{3/2}$ (T unit), and formula $S iO_{4/2}$ (Q unit) in the resinous organopolysiloxane.

In the $(Ar_2SiO_{2/2})$ unit, Ar denotes aryl group. The aryl groups may be unsubstituted or substituted, and are preferably C6-20 aryl groups; examples are phenyl, tolyl, xylyl, naphthyl, anthracenyl, phenanthryl, and pyrenyl groups, and groups obtained by substituting hydrogen atoms of these aryl groups with alkyl groups such as methyl and ethyl groups; alkoxy groups such as methoxy and ethoxy groups; and halogen atoms such as chlorine and bromine atoms. The aryl groups are particularly preferably phenyl groups.

The resinous organopolysiloxane, as inventive component (A), is preferably such that the proportion of $(Ar_2SiO_{2/2})$ unit in the molecular structure is 0.05 or more, preferably 0.1 or more, more preferably 0.15 or more, and very preferably 0.2 or more. In a preferred embodiment, the inventive resinous organopolysiloxane is such that the proportion of $(Ar_2SiO_{2/2})$ unit in the molecular structure is ≤0.5, preferably ≤0.45, and more preferably ≤0.4.

In the resinous organopolysiloxane containing at least one $(Ar_2SiO_{2/2})$ unit, as component (A), preferably 40 mol % or more of the monovalent hydrocarbon groups bound to silicon atoms are aryl groups, and more preferably 50 mol % or more, particularly preferably 60 mol % or more, are aryl groups.

Preferably, component (A) resinous organopolysiloxane is represented by average unit formula (A-4) below:

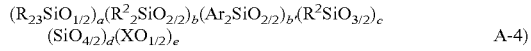

(A-4)

(in the formula, $R^2$ and Ar are as described above, and at least two $R^2$ per molecule are alkenyl groups; X is a hydrogen atom or alkyl group; $R^2_2SiO_{2/2}$ is a unit other than $Ar_2SiO_{2/2}$; and a, b, b', c, d, and e are numbers that satisfy 0≤a≤1.0, 0≤b≤1.0, 0<b'≤1.0, 0≤c<0.9, 0≤d<0.5, 0≤e<0.4, a+b+b'+c+d=1.0, and c+d>0).

In average unit formula (A-4), a is preferably in the range 0≤a≤0.5, more preferably in the range 0≤a≤0.3, very preferably in the range 0≤a≤0.2, and particularly preferably in the range 0≤a≤0.1. In average unit formula (A-4), b is preferably in the range 0≤b≤0.8, more preferably in the range 0.1≤b≤0.7, and particularly preferably in the range 0.15≤b≤0.6. In average unit formula (A-4), b' is preferably in the range 0.1≤b'≤0.7, more preferably in the range 0.2≤b'≤0.6, and particularly preferably in the range 0.25≤b'≤0.5. In average unit formula (A-4), c is preferably in the range 0.1≤c≤0.9, more preferably in the range 0.2≤c≤0.85, and particularly preferably in the range 0.3≤c≤0.8. In average unit formula (A-4), d is preferably in the range 0≤d≤0.4, more preferably in the range 0≤d≤0.3, and particularly preferably in the range 0≤d≤0.2. In average unit formula (A-4), e is preferably in the range 0≤e≤0.3, more preferably in the range 0≤e≤0.2, and particularly preferably in the range 0≤e≤0.1.

The inventive curable silicone composition preferably contains as component (A), based on the total mass of the composition, 10% by mass or more, preferably 20% by mass or more, more preferably 30% by mass or more, and even more preferably 40% by mass or more of resinous organopolysiloxane containing at least one $(Ar_2SiO_{2/2})$ unit. In a preferred embodiment, the inventive curable silicone composition contains, based on the total mass of the composition, ≤90% by mass, preferably ≤80% by mass, more preferably ≤70% by mass, of resinous organopolysiloxane containing at least one $(Ar_2SiO_{2/2})$ unit.

The inventive composition, based on its total mass, contains preferably 30% by mass or more, more preferably 40% by mass or more, even more preferably 50% by mass or more, very preferably 60% by mass or more, and can contain preferably ≤90% by mass, more preferably ≤85% by mass, and particularly ≤80% by mass, of component (A).

(B) Resinous Organohydrogenpolysiloxane

The component (B) resinous organohydrogenpolysiloxane having at least two silicon-bonded hydrogen atoms per molecule (that is, branched organohydrogenpolysiloxane) acts as a cross-linking agent for curable silicone compositions that are curable by hydrosilylation. Preferably, component (B) is a resinous organohydrogenpolysiloxane having silicon-bonded hydrogen atoms at least at both ends of the molecular chain. One organopolysiloxane or a combination of 2 or more organopolysiloxanes can be used as component (B).

The component (B) silicon-bonded hydrogen atoms are preferably present at least at both ends of the molecular chain; silicon-bonded hydrogen atoms may be present only at both ends of the molecular chain, or they may also be present on side chains of the molecular chain. Examples of groups other than hydrogen atoms that can be bonded to the silicon atoms in component (B) are C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; and groups obtained by substituting some or all of the hydrogen atoms of these groups with halogen atoms such as fluorine, chlorine, and/or bromine atoms. The silicon atoms in component (B) may also have a small amount of hydroxyl groups or alkoxy groups such as methoxy or ethoxy groups, provided that this does not adversely affect the aim of the present invention.

In one embodiment of the present invention there can be resinous organohydrogenpolysiloxane represented by average unit formula (B-1):

$$(R^3_3SiO_{1/2})_a(R^3_2SiO_{2/2})_b(R^3SiO_{3/2})_c(SiO_{4/2})_d(XO_{1/2})_e$$

(in the formula, $R^3$ is an identical or different halogen-substituted or unsubstituted monovalent hydrocarbon group, where at least two $R^3$ are hydrogen atoms; X is a hydrogen atom or alkyl group; and a, b, c, d, and e are numbers that satisfy $0 \leq a \leq 1.0$, $0 \leq b \leq 1.0$, $0 \leq c < 0.9$, $0 \leq d < 0.5$, $0 \leq e < 0.4$, a+b+c+d=1.0, and c+d>0).

Examples of halogen-substituted or unsubstituted monovalent hydrocarbon groups $R^3$ in abovementioned formula B-1 are C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; C2-12 alkenyl groups such as vinyl, allyl, butenyl, pentenyl, hexenyl, heptenyl, octenyl, nonenyl, decenyl, undecenyl, and dodecenyl groups; and groups obtained by substituting some or all of the hydrogen atoms of these groups with halogen atoms such as fluorine, chlorine, and/or bromine atoms. $R^3$ may also be a hydroxyl group or an alkoxy group such as methoxy or ethoxy, in small amounts, provided that this does not adversely affect the aim of the present invention.

In abovementioned formula B-1, a is preferably in the range $0.1 \leq a \leq 0.9$, more preferably in the range $0.2 \leq a \leq 0.8$, and particularly preferably in the range $0.4 \leq a \leq 0.7$. In abovementioned formula B-1, b is preferably in the range $0 \leq b \leq 0.8$, more preferably in the range $0 \leq b \leq 0.5$, particularly preferably in the range $0 \leq b \leq 0.2$. In abovementioned formula B-1, c is preferably in the range $0.1 \leq c \leq 0.9$, more preferably in the range $0.2 \leq c \leq 0.7$, particularly preferably in the range $0.3 \leq c \leq 0.5$. In abovementioned formula B-1, d is preferably in the range $0 \leq d \leq 0.4$, more preferably in the range $0 \leq d \leq 0.3$, particularly preferably in the range $0 \leq d \leq 0.2$. In abovementioned formula B-1, e is preferably in the range $0 \leq e \leq 0.3$, more preferably in the range $0 \leq e \leq 0.2$, particularly preferably in the range $0 \leq e \leq 0.1$.

The inventive curable hot-melt silicone composition contains 0.1-5% by mass of component (B-1), based on the total mass of the inventive composition. The inventive curable hot-melt silicone composition contains preferably 0.5% by mass or more, more preferably 1% by mass or more, of component (B), based on the total mass of the inventive composition; for example, the inventive curable hot-melt silicone composition can contain ≤4.5% by mass of component (B).

In an embodiment of the present invention, component (B) is such that there are preferably 0.001-5 mol, more preferably 0.01-2 mol, and particularly preferably 0.05-1 mol of silicon-bonded hydrogen atoms in this component per mol of silicon-bonded alkenyl groups in component (A).

In addition to abovementioned component (B), the curable hot-melt silicone composition can also contain, as component (B'), an organohydrogenpolysiloxane to act as cross-linking agent for curable silicone compositions that are curable by hydrosilylation. This component (B') is preferably a linear organohydrogenpolysiloxane. One organopolysiloxane, or a combination of 2 or more organopolysiloxanes, can be used as component (B').

The component (B') silicon-bonded hydrogen atoms are preferably present at least at both ends of the molecular chain; silicon-bonded hydrogen atoms may be present only at both ends of the molecular chain, or they may also be present on side chains of the molecular chain. Examples of groups other than hydrogen atoms that can be bonded to the silicon atoms in component (B) are C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; and groups obtained by substituting some or all of the hydrogen atoms of these groups with halogen atoms such as fluorine, chlorine, and/or bromine atoms. The silicon atoms in component (B') may also have a small amount of hydroxyl groups or alkoxy groups such as methoxy or ethoxy groups, provided that this does not adversely affect the aim of the present invention.

In an embodiment of the present invention, component (B') is a linear organohydrogenpolysiloxane represented by average structural formula (B-2): $(R^3_3SiO_{1/2})_a(R^3_2SiO_{2/2})_b(XO_{1/2})_e$ (in the formula, $R^3$ and X are as described above, and a, b, and e are numbers that satisfy $0 \leq a \leq 1.0$, $0 \leq b \leq 1.0$, $0 \leq e < 0.4$, and a+b=1.0).

In an embodiment of the present invention, component (B') can be represented by the structural formula below:

$$[HR^4_2SiO_{1/2}]_2[R^4_2SiO_{2/2}]_y$$

In the formula, $R^4$ is an identical or different halogen-substituted or unsubstituted monovalent hydrocarbon group, and y is a number in the range 1-100, preferably 1-10. The halogen-substituted or unsubstituted monovalent hydrocarbon groups $R^4$ are the same as those described for $R^3$.

The inventive curable hot-melt silicone composition, based on its total mass, contains preferably 1% by mass or more, more preferably 5% by mass or more, very preferably 10% by mass or more, and particularly preferably 15% by mass or more, and can contain preferably ≤50% by mass, more preferably ≤40% by mass, and particularly preferably ≤30% by mass, of component (B').

The total amount of components (B) plus (B') is preferably such that there are 0.1-10 mol, more preferably 0.5-5 mol, and particularly preferably 0.5-1.5 mol of silicon-bonded hydrogen atoms in these components per mol of silicon-bonded alkenyl groups in component (A). The inventive curable hot-melt silicone composition, based on its total mass, contains preferably 1% by mass or more, more preferably 5% by mass or more, very preferably 10% by mass or more, and particularly preferably 15% by mass or more, and can contain preferably ≤50% by mass, more preferably ≤40% by mass, and particularly preferably ≤30% by mass, of components (B) plus (B') in total.

(C) Additive

The additive used as inventive component (C) is a siloxane compound represented by average unit formula (C-1):

$$(R^1_3SiO_{1/2})_a(R^1_2SiO_{2/2})_b(R^1SiO_{3/2})_c$$

(in the formula, $R^1$ is an identical or different alkyl group, aryl group, alkenyl group, aralkyl group, or epoxy group-containing organic group or alkoxy group, where at least one $R^1$ is an alkenyl group, and at least one $R^1$ is an epoxy group-containing organic group; and a, b, and c are numbers that satisfy $0 \leq a \leq 1.0$, $0 \leq b \leq 1.0$, $0 \leq c < 0.9$, respectively, and a+b+c=1).

That is, component (C) contains at least one silicon atom-bonded alkenyl group, and at least one epoxy group-containing organic group.

Examples of "epoxy group-containing groups", in the present specification, are glycidoxyalkyl groups such as 2-glycidoxyethyl, 3-glycidoxypropyl and 4-glycidoxybutyl groups; epoxycycloalkylalkyl groups such as 2-(3,4-epoxycyclohexyl)-ethyl and 3-(3,4-epoxycyclohexyl)-propyl groups; and epoxyalkyl groups such as 3,4-epoxybutyl and 7,8-epoxyoctyl groups; and glycidoxyalkyl groups are preferred, and 3-glycidoxypropyl is particularly preferred.

Examples of "alkoxy groups", in the present specification, are methoxy, ethoxy, butoxy, phenoxy, pentyloxy, allyloxy, cyclohexyloxy, benzyloxy, naphthyloxy, and acetoxy groups, etc.; methoxy and ethoxy groups are preferred, and ethoxy is particularly preferred.

Examples of alkenyl groups contained in component (C) are C2-12 alkenyl groups such as vinyl, allyl, butenyl, pentenyl, hexenyl, heptenyl, octenyl, nonenyl, decenyl, undecenyl, and dodecenyl groups, and vinyl is preferred.

$R^1$ in abovementioned formula C-1 are preferably chosen from C1-12 alkyl groups, C6-20 aryl groups, and C7-20 aralkyl groups. Specific examples of $R^1$ in abovementioned formula C-1 are alkyl groups such as methyl, ethyl, propyl, butyl, pentyl, hexyl, heptyl, octyl, nonyl, decyl, undecyl, and dodecyl groups; alkenyl groups such as vinyl, allyl, butenyl, pentenyl, hexenyl, heptenyl, octenyl, nonenyl, decenyl, undecenyl, and dodecenyl groups; aryl groups such as phenyl, tolyl, xylyl, naphthyl, anthracenyl, phenanthryl, and pyrenyl groups; aralkyl groups such as naphthylethyl, naphthylpropyl, anthracenylethyl, phenanthrylethyl, and pyrenylethyl groups; and groups obtained by substituting some or all of the hydrogen atoms on these aryl groups and aralkyl groups with alkyl groups such as methyl and ethyl groups, alkoxy groups such as methoxy and ethoxy groups, and/or halogen atoms such as chlorine and bromine atoms; methyl, vinyl and phenyl groups are preferred.

In abovementioned formula C-1, a is preferably in the range $0 \le a \le 0.9$, more preferably in the range $0 \le a \le 0.5$, and particularly preferably in the range $0 \le a \le 0.3$. In abovementioned formula C-1, b is preferably in the range $0.1 \le b \le 0.9$, more preferably in the range $0.2 \le b \le 0.8$, and particularly preferably in the range $0.25 \le b \le 0.7$. In abovementioned formula C-1, c is preferably in the range $0.01 \le c \le 0.8$, more preferably in the range $0.1 \le c \le 0.7$, and particularly preferably in the range $0.2 \le c \le 0.6$.

There are no particular limitations regarding the amount of alkenyl groups contained in component (C); for example, it can be 1 mol % or more, preferably 5 mol % or more, or more preferably 8 mol % or more, for example $\le 40$ mol %, preferably $\le 30$ mol %, more preferably $\le 30$ mol %, of the total amount of $R^1$. It should be noted that the alkenyl group content can be found by analysis such as Fourier transform infrared spectrophotometry (FT-IR), nuclear magnetic resonance (NMR), etc.

There are no particular limitations regarding the amount of epoxy-containing organic groups contained in component (C); for example, it can be 1 mol % or more, preferably 5 mol % or more, or more preferably 10 mol % or more, for example $\le 50$ mol %, preferably $\le 40$ mol %, more preferably $\le 35$ mol %, of the total amount of $R^1$. It should be noted that the epoxy-containing organic group content can be found by analysis such as Fourier transform infrared spectrophotometry (FT-IR), nuclear magnetic resonance (NMR), etc.

The inventive curable hot-melt silicone composition, based on the total mass of the inventive composition, contains preferably 0.01% by mass or more, more preferably 0.1% by mass or more, very preferably 0.3% by mass or more, and particularly preferably 0.5% by mass or more, and can contain preferably $\le 20\%$ by mass, more preferably $\le 15\%$ by mass, and very preferably $\le 10\%$ by mass, of component (C).

(D) Hydrosilylation Catalyst

The hydrosilylation catalyst component (D) is a catalyst for promoting curing of the inventive curable hot-melt silicone composition. Examples of component (D) are platinum catalysts such as chloroplatinic acid, alcohol solution of chloroplatinic acid, platinum-olefin complex, platinum-1,3-divinyl-1,1,3,3-tetramethyldisiloxane complex, and platinum-supporting powder; palladium catalysts such as tetrakis(triphenylphosphine)palladium, and mixtures of triphenylphosphine and palladium black; and rhodium catalysts; platinum catalysts are particularly preferred.

The amount of component (D) is the amount of catalyst; when a platinum catalyst is used as component (D), the practically preferable amount of platinum metal contained in the platinum catalyst is in the range of 0.01-1000 ppm, particularly preferably 0.1-500 ppm by weight unit in the inventive curable hot-melt silicone composition.

(E) Silica

Examples of silica used as component (E) are fumed silica, wet silica, crystalline silica, precipitated silica, etc. Also, the silica may have been subjected to surface hydrophobic treatment using a organosilicon compound such as an organoalkoxysilane compound, organochlorosilane compound, organosilazane compound, or low molecular weight siloxane compound, or silane coupling agent, titanate coupling agent or the like.

The amount of component (E) contained in the inventive curable hot-melt silicone composition is, based on the total mass of the inventive composition, preferably 0.01% by mass or more, more preferably 0.1% by mass or more, very preferably 0.5% by mass or more, particularly preferably 1% by mass or more; and the amount contained in the inventive curable hot-melt silicone composition is preferably $\le 20\%$ by mass, more preferably $\le 15\%$ by mass, and very preferably $\le 10\%$ by mass.

Optional components can be incorporated into the inventive curable hot-melt silicone composition, provided that this does not adversely affect the aim of the present invention. Examples of optional components are acetylene compounds, organic phosphorus compounds, vinyl group-containing siloxane compounds, and hydrosilylation reaction inhibitors; inorganic filler (also called "inorganic filler material") other than (E) silica, such as ground quartz, titanium oxide, magnesium carbonate, zinc oxide, iron oxide, diatomaceous earth; inorganic filler obtained by hydrophobically treating the surface of these inorganic fillers using an organosilicon compound; organopolysiloxanes containing no silicon-bonded hydrogen atoms or silicon-bonded alkenyl groups; adhesiveness imparting agent, heat resistance imparting agent, cold resistance imparting agent, heat conductive filler, flame retardant imparting agent, thixotropy imparting agent, phosphors, coloring components such as dyes and pigments, e.g. carbon black, and solvents, etc.

Hydrosilylation inhibitor is a component for suppressing the hydrosilylation of the silicone composition; specific examples are acetylene-based reaction inhibitors such as 1-ethynyl-2-cyclohexanol, and amine-, carboxylic acid ester-, and phosphite ester-based reaction inhibitors. The amount of reaction inhibitor added is usually 0.001-5% by mass of the silicone composition.

Examples of inorganic fillers other than the (E) silica are hollow filler, silsesquioxane, fumed titanium dioxide, magnesium oxide, zinc oxide, iron oxide, aluminum hydroxide, magnesium carbonate, calcium carbonate, zinc carbonate, layered mica, diatomaceous earth, glass fiber and other inorganic fillers; and fillers obtained by subjecting these fillers to surface hydrophobic treatment using an organosilicon compound such as organoalkoxysilane compound, organochlorosilane compound, organosilazane compound or low molecular weight siloxane compound. Silicone rubber powder, silicone resin powder and the like can also be incorporated. Specifically, the amount of inorganic filler incorporated is preferably ≤20% by mass, particularly preferably ≤10% by mass, of the silicone composition.

Phosphors are widely used in light-emitting diodes (LEDs); examples of phosphors used are yellow, red, green, and blue phosphors such as oxide phosphors, oxynitride phosphors, nitride phosphors, sulfide phosphors, oxysulfide phosphors, and fluoride phosphors, and mixtures of at least 2 of these. Examples of oxide phosphors are cerium ion-doped yttrium aluminum garnet (YAG) green to yellow phosphors; cerium ion-doped terbium aluminum garnet (TAG) yellow phosphors; and cerium and europium ion-doped silicate green to yellow phosphors. Examples of oxynitride phosphors are europium ion-doped silicon aluminum oxygen nitrogen red-green phosphors. Examples of nitride phosphors are europium ion-doped calcium strontium aluminum silicon nitrogen red phosphors. Examples of sulfide phosphors are copper ion- and aluminum ion-doped ZnS green phosphors. Examples of oxysulfide phosphors are europium ion-doped $Y_2O_2S$ red phosphors. Examples of fluoride phosphors are KSF phosphors ($K_2SiF_6$:$Mn^{4+}$), etc.

Organic or inorganic pigments and dyes can be used as coloring components; these can be used individually, or two or more can be used in combination. When phosphors are used, the amount incorporated is ≤90% by mass, preferably ≤80% by mass, particularly ≤70% by mass, of the silicone composition. Also, black pigment can be used to prevent light interference and improve color contrast in the display. For example, iron oxide, aniline black, activated carbon, graphite, carbon nanotubes, carbon black or the like can be used as black pigment. Specifically, the amount of coloring component incorporated is ≤30% by mass, preferably ≤15% by mass, particularly preferably ≤5% by mass, of the silicone composition.

The inventive curable hot-melt silicone composition can be prepared by mixing the various components. The method for mixing the various components should be a conventional known method, and there are no particular limitations on this; usually it is simple mixing to obtain a uniform mixture. When solid components such as inorganic filler are included as optional components, it is preferable to use a mixing device for the mixing. There are no particular limitations regarding this mixing device, and examples include single- and twin-screw continuous mixers, double roller mixers, Ross mixers, Hobart mixers, dental mixers, planetary mixers, kneader mixers, and Henschel mixers.

The inventive curable hot-melt silicone composition can exhibit excellent mechanical properties, particularly strength and extension, even when formed in a film or sheet-shape. Consequently, the inventive curable hot-melt silicone composition has excellent handling workability and can form encapsulant and lamination film for the manufacture of semiconductor packages, and allows efficient manufacture of semiconductor packages. Therefore, the inventive curable hot-melt silicone composition is useful for sheet-shaped or film-shaped encapsulant, and film for lamination, in the manufacture of semiconductor packages.

[Encapsulant and Film]

The present invention also relates to an encapsulant for semiconductors, obtained using the inventive curable hot-melt silicone composition. There are no particular limitations regarding the shape of the encapsulant, and it is preferably film-shaped or sheet-shaped. Consequently, the present invention also relates to a film obtained by solidifying the inventive curable hot-melt silicone composition. The inventive film is preferably used as film for lamination, and film-shaped encapsulant for encapsulating a semiconductor element. There are no particular limitations regarding the semiconductor to be encapsulated by the inventive encapsulant or film; examples are semiconductors such as SiC and GaN, and particularly optical semiconductors such as power semiconductors and light-emitting diodes.

The inventive encapsulant or film, despite being film or sheet-shaped, has excellent mechanical properties, particularly strength and extension, and therefore has excellent handling workability and allows very efficient manufacture of semiconductor packages.

[Optical Semiconductor Element]

The present invention also relates to an optical semiconductor element containing the inventive encapsulant. The optical semiconductor element can be, for example, a light-emitting diode (LED), semiconductor laser, photodiode, phototransistor, or a light-emitting body or light-receiving body for solid-state imaging or photocoupler; it is particularly preferably a light-emitting diode (LED).

Light-emitting diodes (LEDs) emit light from the upper, lower, left and right sides of the optical semiconductor element, and so it is undesirable for parts constituting the light-emitting diode (LED) to absorb light, and materials having high light transmittance or high reflectance are preferred for said parts. Consequently, the substrate on which the optical semiconductor element is mounted also preferably comprises a material of high light transmittance or high reflectance. Examples of this substrate on which the optical semiconductor element is mounted are conductive metals such as silver, gold and copper; non-conductive metals such as aluminum and nickel; thermoplastic resins mixed with white pigment, such as PPA and LCP; thermosetting resins containing white pigment, such as epoxy resin, BT resin, polyimide resin and silicone resin; and ceramics such as alumina and alumina nitride.

The inventive optical semiconductor element has the excellent handling workability of the present invention, and contains encapsulant that allows efficient manufacture of semiconductor packages, and so it has excellent reliability.

EXAMPLES

The inventive curable hot-melt silicone composition is described in more detail by means of the following examples and comparative examples.

Examples 1-22 and Comparative Examples 1-5

Curable hot-melt silicone compositions were prepared by mixing the respective components in the proportions (parts by weight) shown in Tables 1-4. It should be noted that below, Me denotes methyl, Vi denotes vinyl, Ph denotes phenyl, and Ep denotes 3-glycidoxypropyl.

Component a-1: resinous alkenyl group-containing organopolysiloxane represented by average unit formula $(ViMeSiO_{2/2})_{25}(Ph_2SiO_{2/2})_{30}(PhSiO_{3/2})_{45}$ Component a-2: resinous alkenyl group-containing organopolysiloxane represented by average unit formula $(ViMe_2SiO_{1/2})_{25}(PhSiO_{3/2})_{75}$ Component a-3: linear alkenyl group-containing organopolysiloxane represented by general formula $(ViMe_2SiO_{1/2})(PhMeSiO_{2/2})_{20}(ViMe_2SiO_{1/2})$ Component a-4: cyclic alkenyl group-containing organopolysiloxane represented by general formula $(ViMeSiO_{2/2})_4$ Component a-5: resinous alkenyl group-containing organopolysiloxane represented by general formula $(ViMe_2SiO_{1/2})_3(PhSiO_{3/2})$
Component b-1: resinous organohydrogenpolysiloxane represented by average unit formula $(HMe_2SiO_{1/2})_{60}(PhSiO_{3/2})_{40}$
Component b-2: linear organohydrogenpolysiloxane represented by general formula $(HMe_2SiO_{1/2})(Ph_2SiO_{2/2})(HMe_2SiO_{1/2})$
Component c-1: additive represented by average unit formula $(ViMe_2SiO_2)_{25}(PhSiO_{3/2})_{75}(EpMeSiO_{2/2})_{40}$
Component c-2: additive represented by structural formula $(Me_2SiO_{2/2})(ViMeSiO_{2/2})(EpSiO_{3/2})$
Component c-3: additive represented by average unit formula $(EpMeSiO_{2/2})_{48}(ViSiO_{3/2})_{21}(PhSiO_{3/2})_{31}$
Component c-4: additive represented by general formula $(ViMe_2SiO_{1/2})(Me_2SiO_{2/2})_3Si(OMe)_3$
Component c-5: additive represented by average unit formula $(ViMe_2SiO_{1/2})_{15}(Me_2SiO_{2/2})_{35}(PhSiO_{3/2})_{50}$
Component d: complex of platinum and 1,3-divinyl-1,1,3,3-tetramethyldisiloxane, having a platinum concentration of 4.0% by mass
Component e: 1-ethynyl-2-cyclohexanol (platinum catalyst inhibitor)
Component f: fumed silica
Component g: carbon black

[Evaluation]

The tensile strength (MPa) and extension at break (%) of the cured products obtained using the curable hot-melt silicone compositions of examples 1-22 and comparative examples 1-5 were measured in accordance with JIS K 6251. Specifically, the curable hot-melt silicone compositions of examples 1-22 and comparative examples 1-5 were heat-aged at 120° C. for 5-10 minutes to obtain the respective hot-melt cured products. The melt elastic modulus at 100° C. of each resulting hot-melt cured product was measured using a viscoelasticity meter (MCR302, manufactured by Anton Paar), and found to be 30-300 Pa. A test piece was formed in a shape conforming to dumbbell shape No. 3 with a thickness of 180 μm. Using the test piece, the tensile strength (MPa) and elongation at break (%) were measured, at a tensile speed of 500 mm/min. The results are shown in Tables 1-4. Products having a tensile strength of 1 MPa or more and an extension at break of 200% or more have excellent handling workability as an encapsulant film or laminate film.

TABLE 1

| Component | Example 1 | Example 2 | Example 3 | Example 4 | Example 5 | Example 6 | Example 7 |
|---|---|---|---|---|---|---|---|
| a-1 | 56.9 | 56.5 | 58.3 | 53.1 | 51.3 | 55.9 | 59.7 |
| a-2 | 4 | 3.3 | 3.3 | 3.4 | 3.3 | 3.3 | 3.3 |
| a-3 | 14.9 | 9.1 | 6.6 | 11.7 | 6.6 | 6.6 | 6.6 |
| a-4 | 0.2 | 0.2 | 0.2 | 3.0 | 0.2 | 0.2 | 0.2 |
| a-5 | — | 3.5 | 3.7 | — | 3.7 | 3.7 | 3.7 |
| b-1 | 2.5 | 2.5 | 2.5 | 3.5 | 2.5 | 2.5 | 2.5 |
| b-2 | 19.0 | 22.4 | 22.9 | 22.8 | 22.4 | 22.8 | 23.0 |
| c-1 | 2.5 | 2.5 | 2.5 | 2.5 | 10.0 | 5.0 | 1.0 |
| D | 0.01 | 0.01 | 0.01 | 0.02 | 0.01 | 0.01 | 0.01 |
| E | 0.02 | 0.02 | 0.02 | 0.02 | 0.02 | 0.02 | 0.02 |
| F | 3 | 3 | 3 | 3 | 3 | 3 | 3 |
| Total of components a-c | 100 | 100 | 100 | 100 | 100 | 100 | 100 |
| Evaluation | | | | | | | |
| Tensile strength (MPa) | 1.7 | 1.6 | 1.9 | 3.0 | 1.4 | 1.2 | 1.7 |
| Extension at break (%) | 250 | 250 | 300 | 230 | 205 | 210 | 250 |

TABLE 2

| Component | Example 8 | Example 9 | Example 10 | Example 11 | Example 12 | Example 13 | Example 14 | Example 15 | Example 16 |
|---|---|---|---|---|---|---|---|---|---|
| a-1 | 58.0 | 58.2 | 47.1 | 47.1 | 47.1 | 58.0 | 53.1 | 58.2 | 58.2 |
| a-2 | 3.3 | 3.3 | — | — | — | — | — | 3.3 | 3.3 |
| a-3 | 6.6 | 6.6 | 25.3 | 25.3 | 25.3 | 15.9 | 25.1 | 6.6 | 6.6 |
| a-4 | 0.2 | 0.2 | 2.3 | 2.3 | 2.3 | 1.2 | — | 0.2 | 0.2 |
| a-5 | 3.7 | 3.7 | — | — | — | — | — | 3.7 | 3.7 |
| b-1 | 2.5 | 2.5 | 4.2 | 4.2 | 4.2 | 3.0 | 1.6 | 1.0 | 2.0 |
| b-2 | 23.2 | 23.0 | 18.6 | 18.6 | 18.6 | 19.4 | 17.7 | 24.5 | 23.5 |
| c-1 | — | — | 2.5 | 2.5 | 2.5 | 2.5 | 2.5 | 2.5 | 2.5 |
| c-2 | 2.5 | — | — | — | — | — | — | — | — |
| c-3 | — | 2.5 | — | — | — | — | — | — | — |
| D | 0.01 | 0.01 | 0.02 | 0.02 | 0.02 | 0.01 | 0.01 | 0.01 | 0.01 |
| E | 0.02 | 0.02 | 0.02 | 0.02 | 0.02 | 0.02 | 0.02 | 0.02 | 0.02 |
| F | 3 | 3 | 3 | 3 | 3 | 3 | 3 | 3 | 3 |
| G | — | — | 0.1 | 0.3 | 2.0 | — | — | — | — |
| Total of components a-c | 100 | 100 | 100 | 100 | 100 | 100 | 100 | 100 | 100 |

TABLE 2-continued

| Component | Example 8 | Example 9 | Example 10 | Example 11 | Example 12 | Example 13 | Example 14 | Example 15 | Example 16 |
|---|---|---|---|---|---|---|---|---|---|
| Evaluation | | | | | | | | | |
| Tensile strength (MPa) | 1.1 | 1.2 | 2.5 | 2.6 | 2.9 | 2.1 | 2.0 | 1.1 | 1.3 |
| Extension at break (%) | 280 | 270 | 250 | 260 | 220 | 230 | 270 | 400 | 450 |

TABLE 3

| Component | Example 17 | Example 18 | Example 19 | Example 20 | Example 21 | Example 22 |
|---|---|---|---|---|---|---|
| a-1 | 60.1 | 59.6 | 55.4 | 59.6 | 55.8 | 51.0 |
| a-2 | 3.3 | 3.3 | 3.3 | 3.3 | 3.3 | 3.3 |
| a-3 | 6.6 | 6.6 | 6.6 | 6.6 | 6.6 | 6.6 |
| a-4 | 0.2 | 0.2 | 0.2 | 0.2 | 0.2 | 0.2 |
| a-5 | 3.7 | 3.7 | 3.7 | 3.7 | 3.7 | 3.7 |
| b-1 | 2.5 | 2.5 | 2.5 | 2.5 | 2.5 | 2.5 |
| b-2 | 23.1 | 23.1 | 23.3 | 23.1 | 22.9 | 22.7 |
| c-1 | — | — | — | — | — | — |
| c-2 | 0.5 | 1.0 | 5.0 | — | — | — |
| c-3 | — | — | — | 1.0 | 5.0 | 10.0 |
| d | 0.01 | 0.01 | 0.01 | 0.01 | 0.01 | 0.01 |
| e | 0.02 | 0.02 | 0.02 | 0.02 | 0.02 | 0.02 |
| f | 3 | 3 | 3 | 3 | 3 | 3 |
| Total of components a-c | 100 | 100 | 100 | 100 | 100 | 100 |
| Evaluation | | | | | | |
| Tensile strength (MPa) | 1.6 | 2.1 | 1.1 | 2.0 | 1.1 | 1.1 |
| Extension at break (%) | 200 | 230 | 280 | 210 | 450 | 450 |

TABLE 4

| Component | Comparative Example 1 | Comparative Example 2 | Comparative Example 3 | Comparative Example 4 | Comparative Example 5 |
|---|---|---|---|---|---|
| a-1 | 60.6 | 58.0 | 58.2 | 58.1 | 58.5 |
| a-2 | 3.3 | 3.3 | 3.3 | 3.3 | 3.3 |
| a-3 | 6.6 | 6.6 | 6.6 | 6.6 | 6.6 |
| a-4 | 0.2 | 0.2 | 0.2 | 0.2 | 0.2 |
| a-5 | 3.7 | 3.7 | 3.7 | 3.7 | 3.7 |
| b-1 | 2.5 | 2.5 | 2.5 | — | 5.7 |
| b-2 | 23.1 | 23.2 | 23.0 | 25.6 | 19.5 |
| c-1 | — | — | — | 2.5 | 2.5 |
| c-4 | — | 2.5 | — | — | — |
| c-5 | — | — | 2.5 | — | — |
| D | 0.01 | 0.01 | 0.01 | 0.01 | 0.01 |
| E | 0.02 | 0.02 | 0.02 | 0.02 | 0.02 |
| f | 3 | 3 | 3 | 3 | 3 |
| Total of components a-c | 100 | 100 | 100 | 100 | 100 |
| Evaluation | | | | | |
| Tensile strength (MPa) | 1.0 | 0.9 | 1.2 | 0.5 | 3.0 |
| Extension at break (%) | 110 | 250 | 170 | 630 | 100 |

INDUSTRIAL USE

The inventive curable hot-melt silicone composition can form a film or sheet having excellent handling workability, and so is useful for sheet-shaped or film-shaped encapsulant, and film for lamination, in the manufacture of semiconductor packages.

The invention claimed is:

1. A solvent-free curable hot-melt silicone composition containing:
    (A) alkenyl group-containing organopolysiloxane having at least 2 alkenyl groups per molecule, wherein the alkenyl group-containing organopolysiloxane comprises a resinous organopolysiloxane containing alkenyl group and at least one ($Ar_2SiO_{2/2}$) unit,
    (B) resinous organohydrogenpolysiloxane having at least 2 silicon-bonded hydrogen atoms per molecule, at 0.1 to 5% by mass relative to the total mass of the composition,
    (C) additive represented by average unit formula (C-1): $(R^1{}_3SiO_{1/2})_a(R^1{}_2SiO_{2/2})_b(R^1SiO_{3/2})_c$ (in the formula, $R^1$ is an identical or different alkyl group, aryl group, alkenyl group, aralkyl group, or epoxy group-containing organic group or alkoxy group, wherein at least one of $R^1$ is an alkenyl group, and at least one of $R^1$ is an epoxy group-containing organic group; and a, b, and c are numbers that satisfy 0≤a≤1.0, 0≤b≤1.0, 0≤c≤0.9, respectively, and a+b+c=1), (D) hydrosilylation catalyst, and (E) silica.

2. The curable hot-melt silicone composition as claimed in claim 1, where component (A) further contains linear alkenyl group-containing organopolysiloxane.

3. The curable hot-melt silicone composition as claimed in claim 2, where component (B) is represented by average unit formula (B-1): $(R^3_3SiO_{1/2})_a(R^3_2SiO_{2/2})_b(R^3SiO_{3/2})_c(SiO_{4/2})_d(XO_{1/2})_e$ (in the formula, $R^3$ is an identical or different hydrogen atom or halogen-substituted or unsubstituted monovalent hydrocarbon group, where at least two $R^3$ are hydrogen atoms; X is a hydrogen atom or alkyl group; and a, b, c, d, and e are numbers that satisfy 0≤a≤1.0, 0≤b≤1.0, 0≤c≤0.9, 0≤d≤0.5, 0≤e≤0.4, a+b+c+d=1.0, and c+d>0).

4. The curable hot-melt silicone composition as claimed in claim 3, where, in said average unit formula (B-1), a is in the range 0.1≤a≤0.9, b is in the range 0≤b≤0.8, c is in the range 0.1≤c≤0.9, d is in the range 0≤d≤0.4, and e is in the range 0≤e≤0.3.

5. The curable hot-melt silicone composition as claimed in claim 2, where, in said average unit formula (C-1), a is in the range 0≤a≤0.9, b is in the range 0.1≤b≤0.9, and c is in the range 0.01≤c≤0.8.

6. The curable hot-melt silicone composition as claimed in claim 2, where the alkenyl group content in component (C) is ≥5 mol % the total amount of $R^1$.

7. The curable hot-melt silicone composition as claimed in claim 1, where component (B) is represented by average unit formula (B-1): $(R^3_3SiO_{1/2})_a(R^3_2SiO_{2/2})_b(R^3SiO_{3/2})_c(SiO_{4/2})_d(XO_{1/2})_e$ (in the formula, $R^3$ is an identical or different hydrogen atom or halogen-substituted or unsubstituted monovalent hydrocarbon group, where at least two $R^3$ are hydrogen atoms; X is a hydrogen atom or alkyl group; and a, b, c, d, and e are numbers that satisfy 0≤a≤1.0, 0≤b≤1.0, 0≤c≤0.9, 0≤d≤0.5, 0≤e≤0.4, a+b+c+d=1.0, and c+d>0).

8. The curable hot-melt silicone composition as claimed in claim 7, where, in said average unit formula (B-1), a is in the range 0.1≤a≤0.9, b is in the range 0≤b≤0.8, c is in the range 0.1≤c≤0.9, d is in the range 0≤d≤0.4, and e is in the range 0≤e≤0.3.

9. The curable hot-melt silicone composition as claimed in claim 7, where, in said average unit formula (C-1), a is in the range 0≤a≤0.9, b is in the range 0.1≤b≤0.9, and c is in the range 0.01≤c≤0.8.

10. The curable hot-melt silicone composition as claimed in claim 7, where the alkenyl group content in component (C) is ≥5 mol % the total amount of $R^1$.

11. The curable hot-melt silicone composition as claimed in claim 1, where, in said average unit formula (C-1), a is in the range 0≤a≤0.9, b is in the range 0.1≤b≤0.9, and c is in the range 0.01≤c≤0.8.

12. The curable hot-melt silicone composition as claimed in claim 11, where the alkenyl group content in component (C) is ≥5 mol % the total amount of $R^1$, and where the epoxy group-containing organic group content in component (C) is ≥5 mol % the total amount of $R^1$.

13. The curable hot-melt silicone composition as claimed in claim 1, where the alkenyl group content in component (C) is ≥5 mol % the total amount of $R^1$.

14. The curable hot-melt silicone composition as claimed in claim 1, where the epoxy group-containing organic group content in component (C) is ≥5 mol % the total amount of $R^1$.

15. The curable silicone composition as claimed in claim 1, which further contains linear and cyclic organopolysiloxane as component (A).

16. A film obtained by solidifying the curable hot-melt silicone composition as claimed in claim 1.

17. An encapsulant comprising the curable hot-melt silicone composition as claimed in claim 1.

18. An optical semiconductor element containing the encapsulant as claimed in claim 17.

19. The optical semiconductor element as claimed in claim 18, where the optical semiconductor is a light-emitting diode.

20. The curable hot-melt silicone composition as claimed in claim 1, further comprising (B') linear organohydrogenpolysiloxane having at least 2 silicon-bonded hydrogen atoms per molecule.

* * * * *